(12) United States Patent
Liao

(10) Patent No.: US 9,087,912 B2
(45) Date of Patent: Jul. 21, 2015

(54) METHOD FOR WAFER LEVEL PACKAGING AND A PACKAGE STRUCTURE THEREOF

(71) Applicant: CHIPMOS TECHNOLOGIES INC, Hsinchu (TW)

(72) Inventor: Tsung Jen Liao, Hsinchu (TW)

(73) Assignee: CHIPMOS TECHNOLOGIES INC., Hsinchu (TW)

( * ) Notice: Subject to any disclaimer, the term of this patent is extended or adjusted under 35 U.S.C. 154(b) by 0 days.

(21) Appl. No.: 14/198,493

(22) Filed: Mar. 5, 2014

(65) Prior Publication Data

US 2015/0061121 A1  Mar. 5, 2015

(30) Foreign Application Priority Data

Aug. 30, 2013  (TW) ............................. 102131200 A

(51) Int. Cl.
H01L 23/48  (2006.01)
H01L 23/00  (2006.01)

(52) U.S. Cl.
CPC ............... *H01L 24/81* (2013.01); *H01L 24/10* (2013.01)

(58) Field of Classification Search
CPC ................................. H01L 24/10; H01L 24/81
USPC ................................................... 257/735, 737
See application file for complete search history.

(56) References Cited

U.S. PATENT DOCUMENTS

| | | | |
|---|---|---|---|
| 6,489,687 B1 * | 12/2002 | Hashimoto | 257/777 |
| 2012/0153468 A1 * | 6/2012 | Lee | 257/737 |
| 2012/0228750 A1 * | 9/2012 | Okumura | 257/659 |
| 2012/0282735 A1 * | 11/2012 | Ahn et al. | 438/109 |
| 2013/0032390 A1 * | 2/2013 | Hu et al. | 174/266 |

* cited by examiner

*Primary Examiner* — Christine Enad
(74) *Attorney, Agent, or Firm* — Chun-Ming Shih

(57) ABSTRACT

The present disclosure relates to a method for wafer level packaging and a package structure thereof. The method includes several steps. A through hole is formed in the interposer with a thickness that is less than the length of a first conducting pillar. The first conducting pillar is disposed inside the through hole. A redistribution layer is disposed and electrically connected with the first conducting pillar. A solder ball is disposed on the redistribution layer so as to form a wafer level packaging structure.

20 Claims, 4 Drawing Sheets

METHOD FOR WAFER LEVEL PACKAGING AND A PACKAGE STRUCTURE THEREOF

The present application claims priority from Taiwanese application Ser. No. 102131200, filed on Aug. 30, 2013, of the same title and inventorship herewith.

BACKGROUND

1. Technical Field

The present disclosure relates to a package method and a package structure and, more particularly, to a method and a package structure for wafer level packaging.

2. Background

In the through silicon via (TSV) technique and a copper electroplating process, the current silicon interposer acts as an interface, which is electrically coupled between an upper surface of the interposer and a bottom surface of the interposer. Because a diameter of a hole fabricated by the TSV technique is smaller than a conventional hole, it has great difficulty forming a conducting trace in the through hole by using the copper electroplating process. Even if the copper electroplating process is completed, the silicon interposer is required to be grounded so as to create an electrical connection between the upper surface and the bottom surface thereof; hence, the yield rate may be decreased due to the grinding operation. Moreover, in the copper electroplating process, the electroplating solution and device are therefore required to be rearranged and redesigned such that the cost, including the redesign and manufacturing of the device, will be increased.

SUMMARY

The present disclosure provides a method for wafer level packaging and a package structure thereof. The method includes the following steps.

A first wafer including a surface is provided. A dielectric layer and a first conducting pillar are disposed on the surface. The first conducting pillar is configured to penetrate through the dielectric layer.

The first wafer is singulated to form a first die.

A through hole forms in an interposer. A thickness of the interposer is less than or equal to a length of the first conducting pillar.

The first conducting pillar is disposed in the through hole.

An encapsulation layer is covered on the first die and a portion of the interposer.

A first electric insulation layer is coated on a surface of the interposer.

A redistribution layer is formed on the first electric insulation layer by deposition or plating. The redistribution layer is electrically coupled to the first conducting pillar.

A solder ball is disposed on the redistribution layer to complete a wafer level package structure.

The present disclosure also provides a wafer level package structure including a first die, an interposer, an encapsulation layer, a first electric insulation layer, a redistribution layer, and a solder ball. The first die includes a surface. A dielectric layer and a first conducting pillar are disposed on the surface. The first conducting pillar is configured to penetrate through the dielectric layer. The interposer includes at least one through hole. A thickness of the interposer is less than or equal to a length of the first conducting pillar. The first die is disposed on the interposer to allow the first conducting pillar to be located in the through hole. The encapsulation layer is covered on the first die and a portion of the interposer. The first electric insulation layer is disposed on a surface of the interposer. The redistribution layer is disposed on the first electric insulation layer and electrically coupled with the first conducting pillar. The solder ball is disposed on the redistribution layer.

Another function of the present disclosure will be described in the following paragraphs. Certain functions can be realized in the present section, while the other functions can be realized in the detailed description. In addition, the indicated components and the assembly can be explained and achieved by the details of the present disclosure. Notably, the previous explanation and the following description are demonstrated and are not limited to the scope of the present disclosure.

BRIEF DESCRIPTION OF THE DRAWINGS

The accompanying drawings, which are incorporated in and constitute a part of this specification, illustrate embodiments of the disclosure and, together with the description, serve to explain the principles of the invention. The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

DETAILED DESCRIPTION

The wafer-level package method and package structure of the present disclosure include, but are not limited to, the following steps according to various embodiments and may be modified or have certain features deleted in accordance with different design purposes.

Figure 1:
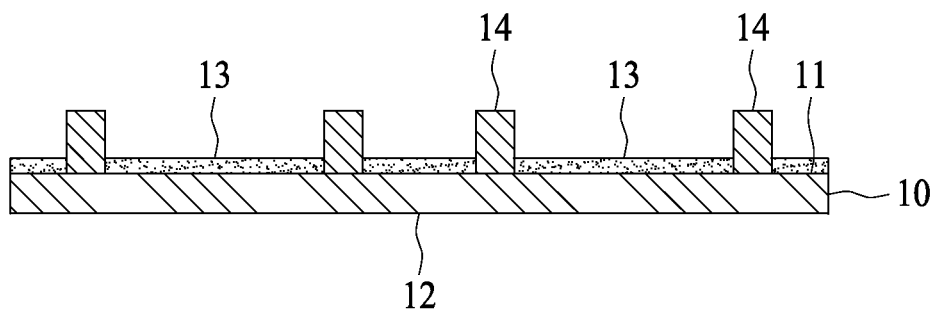
FIG. 1 is a schematic view of a first wafer in accordance with an embodiment of the present disclosure.

Referring to FIG. 1, a first wafer 10 is provided. The first wafer 10 includes a surface 11. At least one first conducting pillar 14 is formed on the surface 11 of the first wafer 10 and the first conducting pillar 14 may be in a circular column shape or a rectangular column shape. Moreover, a dielectric layer 13 is formed on the surface 11, but does not cover the first conducting pillar 14. In other words, the first conducting pillar 14 is configured to penetrate the dielectric layer 13. As shown in FIG. 1, at least one first conducting pillar 14 is disposed on the surface 11. In the specification and patent scope, the term "on" means that a first member is directly or indirectly disposed above the second member. For instance, the sentence that at least one first conducting pillar 14 is disposed on the surface 11 means two embodiments. The first embodiment means that the at least one first conducting pillar 14 is directly disposed on the surface 11. The second embodiment means that the at least one first conducting pillar 14 is indirectly disposed above the surface 11. The term "indirectly" means that in a vertical view, two members are disposed at an upper position and a lower position, respectively, while other objects, material layers or gaps are disposed between the two members.

Figure 2:
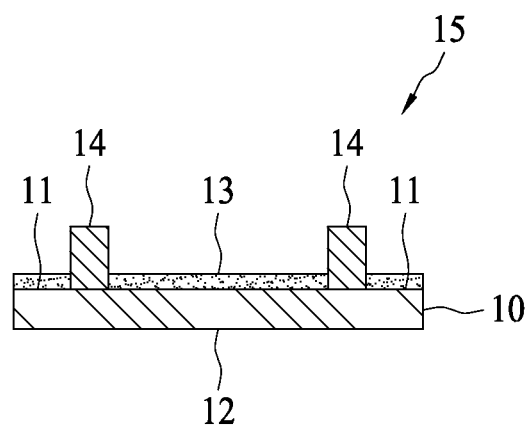
FIG. 2 is a schematic view of a first wafer singulated to form a first die in accordance with the embodiment of the present disclosure.

As shown in FIG. 2, the first wafer 10 is singulated to form a first die 15. In other words, the first die 15 is a portion of the first wafer 10. Thus, the first die 15 has a similar stacking structure to that of the first wafer 10.

Figure 3:
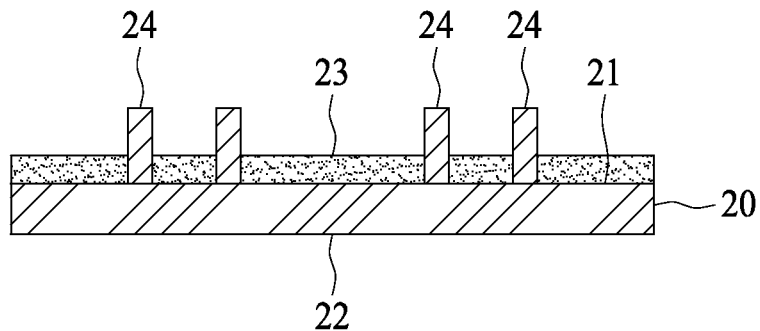
FIG. 3 is a schematic view of a second wafer in accordance with an embodiment of the present disclosure.

As shown in FIG. 3, the second wafer 20 includes an upper surface 21. At least one second conducting pillar 24 is formed on the upper surface 21 and the second conducting pillar 24 may be in a circular column shape or a rectangular column shape. In addition, an electric isolation layer 23 is formed on the upper surface 21, but does not cover the second conducting pillar 24. In other words, the second conducting pillar 24 is configured to penetrate the electric isolation layer 23. In the embodiment, the diameters or widths of the second conducting pillar 24 and the first conducting pillar 14 are different from each other. In particular, the radius of the second conducting pillar 24 is smaller than the radius of the first conducting pillar 14. However, in another embodiment (not shown), the second conducting pillar 24 is designed to have the same diameter or width as that of the first conducting pillar 14.

Figure 4:
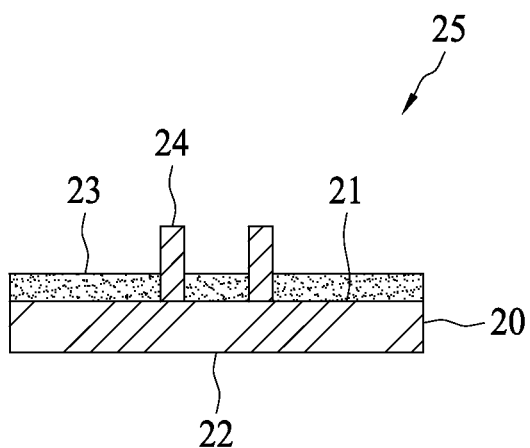
FIG. 4 is a schematic view of the second wafer singulated to form a second die in accordance with the embodiment of the present disclosure.

As shown in FIG. 4, the second wafer 20 is singulated to form a second die 25. In other words, the second die 25 is a portion of the second wafer 20. Thus, the second die 25 has a similar structure to that of the second wafer 20. Moreover, in the embodiment, the thickness of the electric isolation layer 23 on the upper surface 21 is different from the thickness of the dielectric layer 13. In particular, the thickness of the electric isolation layer 23 is greater than the thickness of the dielectric layer 13. The thickness difference is used to avoid an electrically parasitic effect or electrical short. In addition, in the embodiment, the interval between the second conducting pillars 24 is different from the interval between the first conducting pillars 14. In particular, the interval between the second conducting pillars 24 is smaller than the interval between the first conducting pillars 14. However, in other embodiments (not shown), the first wafer 10, and the second wafer 20 may have the same structure. In other words, the diameter, width, or interval between the first conducting pillar 14 and the second conducting pillar 24 can be the same, while the thickness of the electric isolation layer 23 is the same as that of the thickness of the dielectric layer 13.

In other embodiments, the first die 15 and the second die 25 are chips with the same function and hence the first die 15 and the second die 25 have the same size and thickness. In the embodiment, the material of the dielectric layer 13 corresponding to the first die 15 is the same as that of the material of the electric isolation layer 23 corresponding to the second die 25. The interval between the first conducting pillars 14 is the same as that of the interval between the second conducting pillars 24, and the length and diameter of the first conducting pillar 14 are the same as that of the length and diameter of the second conducting pillar 24.

Figure 5:
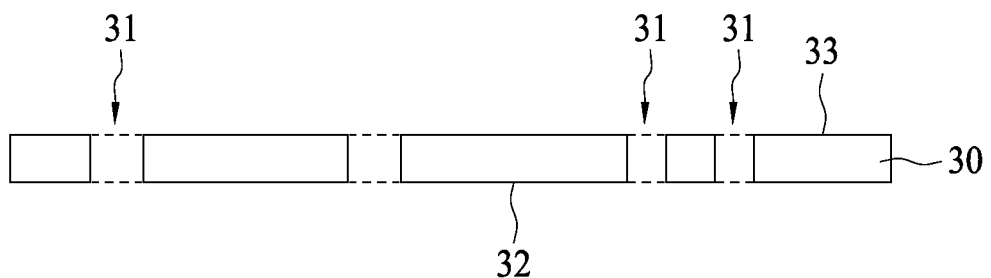
FIG. 5 is a schematic view of forming a through hole in the interposer in accordance with the embodiment of the present disclosure.

As shown in FIG. 5, the interposer 30 includes a surface 32, a surface 33 opposite to the surface 32 and at least one through hole 31. In the embodiment, the material of the interposer 30 may be a silicon wafer. The location of the through hole 31 is designed or adjusted in accordance with the location and diameter of the first conducting pillar 14 and the second conducting pillar 24. Thus, the through holes 31 in relation to either the first conducting pillar 14 or the second conducting pillar 24 may be different. In other embodiments (not shown), the through holes 31 in relation to either the first conducting pillar 14 or the second conducting pillar 24 may have the same diameter.

In the step of forming the through hole 31, the through hole 31 is aligned with either the first conducting pillar 14 or the second conducting pillar 24 so as to accommodate the first conducting pillar 14 and the second conducting pillar 24 in the through holes 31.

As shown in FIG. 5, the thickness of the interposer 30 is less than or equal to the lengths of the first conducting pillar 14 and the second conducting pillar 24. In particular, the thickness of the interposer 30 is less than or equal to the length of either the first conducting pillar 14 or the second conducting pillar 24 minus the length of either the dielectric layer 13 or the electric isolation layer 23.

Figure 6:
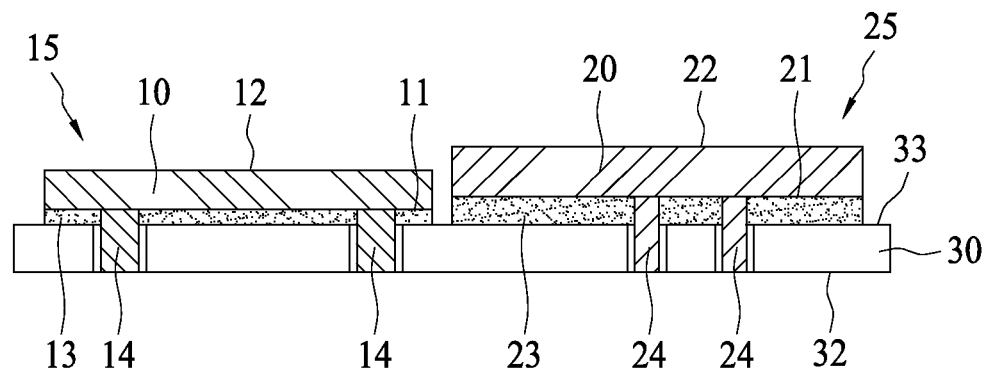
FIG. 6 is a schematic view of locating a first die and a second die on an interposer in accordance with the embodiment of the present disclosure.

As shown in FIG. 6, the first die 15 and the second die 25 are disposed on the interposer 30 to allow the first conducting pillar 14 and the second conducting pillar 24 to penetrate through the through hole 31. In particular, the electric isolation layer 23 and the dielectric layer 13 are disposed on the other surface 33 of the interposer 30. In other words, the first die 15 and the second die 25 are in relation to the surface 33 of the interposer 30. In another embodiment, the electric isolation layer 23 and the dielectric layer 13, such as a die attach film, allows the first die 15 and the second die 25 to temporarily attach on the interposer 30 for temporary fixing.

Figure 7:
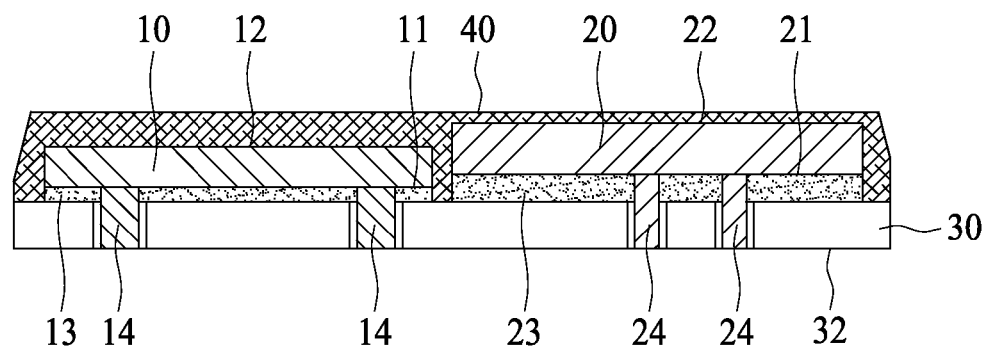
FIG. 7 is a schematic view of covering the interposer with an encapsulation layer in accordance with another embodiment of the present disclosure.

Referring to FIG. 7, a package process is operated by using an encapsulation layer 40 to cover the first die 15 and the second die 25. In other words, the encapsulation layer 40 covers the first wafer 10, the second wafer 20, and a portion of the interposer 30. In particular, the first wafer 10 includes a bottom surface 12, while the second wafer 20 includes a lower surface 22. The encapsulation layer 40 covers the bottom surface 12 and the lower surface 22. The encapsulation layer 40 is useful for fixing the first die 15 and the second die 25 on the interposer 30. Thus, for further processing of the other surface of the interposer 30, the first die 15 and the second die 25 do not detach from the interposer 30 since the interposer 30 will be upside down at that time.

Figure 8:
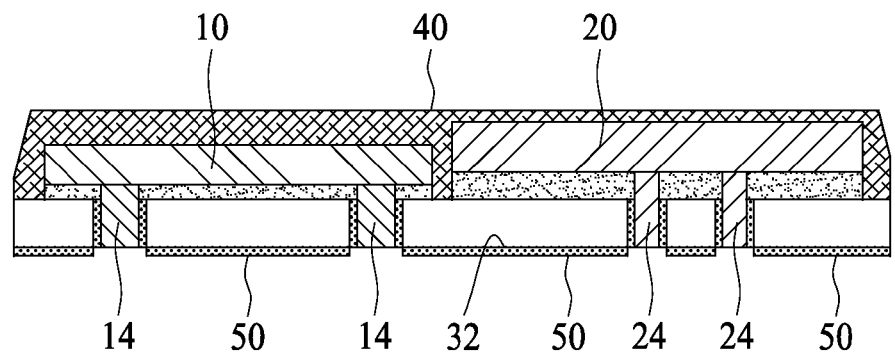
FIG. 8 is a schematic view of coating a first electric insulation layer on the interposer in accordance with another embodiment of the present disclosure.

As shown in FIG. 8, a first electric insulation layer 50 is coated on a surface 32 of the interposer 30. Since there is a gap between the through hole 31 and either the first conducting pillar 14 or the second conducting pillar 24, the first electric insulation layer 50 located near the through hole 31 sinks into the through hole 31. A further photolithographic process allows exposing a portion of the first conducting pillar 14 and the second conducting pillar 24 in order to gain an electric connection. Therefore, since the electric isolation 23, the dielectric layer 13, and the first electric insulation layer 50 perform their functions, the upper surface of the interposer 30 does not form an electrical short with the lower surface of the interposer 30.

Figure 9:
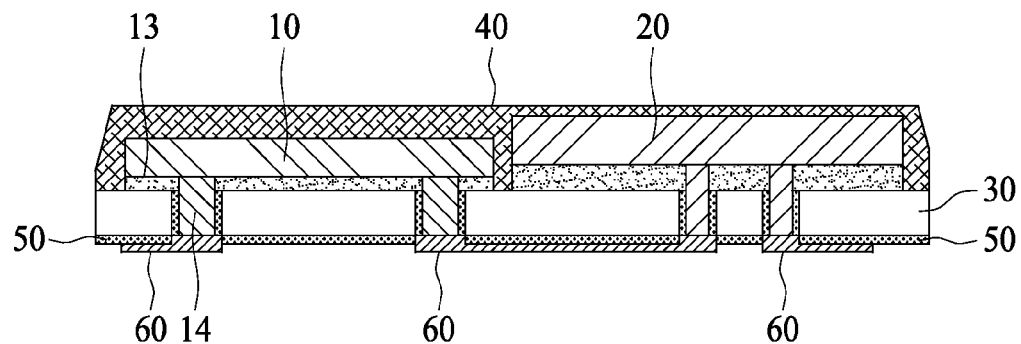
FIG. 9 is a schematic view of forming a redistribution layer on the electric insulation layer in accordance with another embodiment of the present disclosure.
Figure 10:
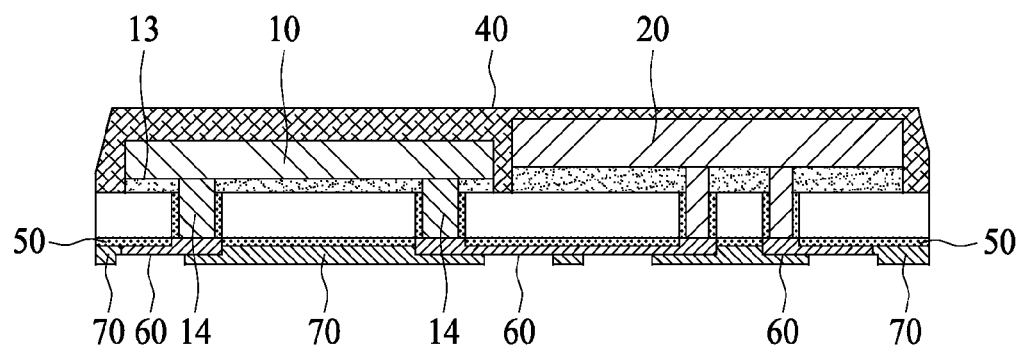
FIG. 10 is a schematic view of coating a second electric insulation layer on the interposer in accordance with another embodiment of the present disclosure.

As shown in FIG. 9, a patterned redistribution layer 60 is formed on the first electric insulation layer 50 by deposition or plating. Because the first electric insulation layer 50 does not cover the first conducting pillar 14 and the second conducting pillar 24, the redistribution layer 60 is electrically connected with the first conducting pillar 14 and the second conducting pillar 24. Referring to FIG. 10, a second electric insulation layer 70 is disposed on the first electric insulation layer 50 and the redistribution layer 60. A further photolithographic process is performed to expose a portion of the redistribution layer 60. In particular, the second electric insulation layer 70 covers the redistribution layer 60 and exposes a portion, which is electrically connected with an outer terminal, such as solder balls, so as to prevent the redistribution layer 60 from being oxidized.

Figure 11:
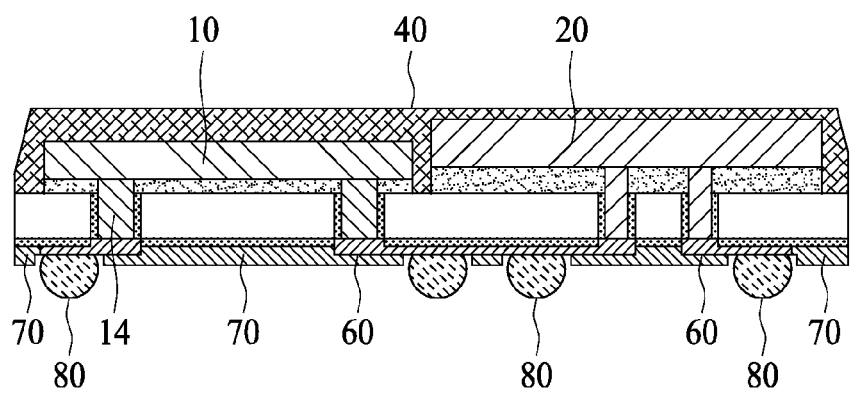
FIG. 11 is a schematic view of disposing a solder ball on the redistribution layer in accordance with another embodiment of the present disclosure.

As shown in FIG. 11, a solder ball 80 is disposed on the portion of the redistribution layer 60 so as to complete the wafer-level package structure.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

What is claimed is:

1. A method for wafer level packaging, comprising:
   providing a first wafer including a surface, wherein a dielectric layer and a first conducting pillar are disposed on the surface and the first conducting pillar is configured to penetrate through the dielectric layer;
   singulating the first wafer to form a first die;
   forming a through hole in an interposer, wherein the interposer includes a first surface and a second surface opposite to the first surface, and a thickness of the interposer is less than or equal to a length of the first conducting pillar;
   disposing the first wafer on the first surface of the interposer and disposing the first conducting pillar inside the through hole;
   covering an encapsulation layer on the first die and a portion of the interposer;
   coating a first electric insulation layer on the second surface of the interposer;
   forming a redistribution layer on the first electric insulation layer, wherein the redistribution layer is electrically coupled to the first conducting pillar; and
   disposing a solder ball on the redistribution layer.

2. The method according to claim 1, further comprising a step of coating a second electric insulation layer on the redistribution layer and the first electric insulation layer.

3. The method according to claim 1, wherein the through hole forming step includes a step of aligning the through hole with the first conducting pillar.

4. The method according to claim 1, further comprising a step of providing a second wafer including an upper surface, wherein an electric isolation layer and a second conducting pillar are disposed on the upper surface, and the second conducting pillar is configured to penetrate through the electric isolation layer.

5. The method according to claim 4, further comprising a step of singulating the second wafer to form a second die.

6. The method according to claim 5, wherein the first wafer includes a bottom surface, the second wafer includes a lower surface, and the encapsulation layer covering step further includes a step of covering the encapsulation layer on the bottom surface and the lower surface.

7. The method according to claim 6, wherein a thickness of the dielectric layer is equal to a thickness of the electric isolation layer.

8. The method according to claim 4, further comprising a step of disposing the electric isolation layer and the dielectric layer on a second surface of the interposer.

9. The method according to claim 4, further comprising a step of disposing the second conducting pillar in the through hole.

10. The method according to claim 4, wherein the redistribution layer forming step includes electrically connecting the redistribution layer to the second conducting pillar.

11. The method according to claim 5, further comprising a step of covering the encapsulation layer on the second die and a portion of the interposer.

12. A wafer level package structure comprising:
   a first die including a surface, wherein a dielectric layer and a first conducting pillar are disposed on the surface, and the first conducting pillar is configured to penetrate through the dielectric layer;
   an interposer includes a first surface, a second surface opposite to the first surface and at least one through hole, wherein a thickness of the interposer is less than or equal to a length of the first conducting pillar; the first die disposed on the first surface of the interposer to allow the first conducting pillar to be located in the through hole;
   an encapsulation layer covered on the first die and a portion of the interposer;
   a first electric insulation layer disposed on the second surface of the interposer;
   a redistribution layer disposed on the first electric insulation layer, wherein the redistribution layer is electrically connected with the first conducting pillar; and
   a solder ball disposed on the redistribution layer.

13. A wafer level package structure comprising:
   a first die including a first surface, wherein a dielectric layer and a first conducting pillar are disposed on the first surface, and the first conducting pillar is configured to penetrate through the dielectric layer;
   a second die including a second surface, wherein an electric isolation layer and a second conducting pillar are disposed on the second surface, and the second conducting pillar is configured to penetrate through the electric isolation layer;
   an interposer includes a top surface, a bottom surface opposite to the top surface and at least one through hole, wherein a thickness of the interposer is less than or equal to a length of the first conducting pillar, and the thickness of the interposer is less than or equal to a length of the second conducting pillar;
   the first die disposed on the top surface of interposer to allow the first conducting pillar to be located in the at least one through hole;
   the second die disposed on the top surface of interposer to allow the second conducting pillar to be located in the at least one through hole;
   an encapsulation layer covered on the first die, the second die and a portion of the interposer;
   a first electric insulation layer disposed on the bottom surface of the interposer;

a redistribution layer disposed on the first electric insulation layer, wherein the redistribution layer is electrically connected with the first conducting pillar or the second conducting pillar; and a solder ball disposed on the redistribution layer.

14. The wafer level package structure according to claim 13, further comprising a second electric insulation layer disposed on the redistribution layer and the first electric insulation layer.

15. The wafer level package structure according to claim 13, wherein the at least one through hole is aligned with the first conducting pillar.

16. The wafer level package structure according to claim 13, wherein the first conducting pillar is in a circular column shape or a rectangular column shape.

17. The wafer level package structure according to claim 13, wherein the second conducting pillar is in a circular column shape or a rectangular column shape.

18. The wafer level package structure according to claim 13, wherein the first die includes a bottom surface, the second die includes a lower surface, and the encapsulation layer covers the bottom surface and the lower surface.

19. The wafer level package structure according to claim 13, wherein a thickness of the dielectric layer is equal to a thickness of the electric isolation layer.

20. The wafer level package structure according to claim 13, wherein the electric isolation layer and the dielectric layer are disposed on the top surface of the interposer.

* * * * *